(12) United States Patent
Yamaguchi

(10) Patent No.: US 7,788,789 B2
(45) Date of Patent: Sep. 7, 2010

(54) METHOD OF FABRICATING CRYSTAL OSCILLATOR WITH PEDESTAL

(75) Inventor: Hiroshi Yamaguchi, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 11/699,107

(22) Filed: Jan. 29, 2007

(65) Prior Publication Data
US 2007/0175026 A1 Aug. 2, 2007

(30) Foreign Application Priority Data
Jan. 31, 2006 (JP) .............................. 2006-023773

(51) Int. Cl.
*H03H 3/02* (2006.01)
*H03H 9/05* (2006.01)

(52) U.S. Cl. .......................... 29/593; 29/25.35; 29/832; 361/760

(58) Field of Classification Search ............... 29/25.35, 29/593, 594, 709, 710, 832; 331/68; 361/760
See application file for complete search history.

(56) References Cited

U.S. PATENT DOCUMENTS 4,058,744 A * 11/1977 Dano et al. ................. 310/343
4,264,202 A * 4/1981 Gugliotta et al. ......... 356/237.1

FOREIGN PATENT DOCUMENTS

| JP | 03103756 A * | 4/1991 |
| JP | 3633971 | 3/2005 |

* cited by examiner

*Primary Examiner*—A. Dexter Tugbang
*Assistant Examiner*—Livius R Cazan
(74) *Attorney, Agent, or Firm*—Scott D. Wofsy; Edwards Angell Palmer & Dodge LLP

(57) ABSTRACT

The present invention provides a method of fabricating a crystal oscillator with pedestal for surface mounting, which is provided on a base surface of a crystal oscillator from which a pair of lead wires extends and which is formed by injection molding using a mold with a liquid-crystal polymer as raw material; wherein protrusions that follow the shape of said mold are provided on at least a corner around the outer periphery of the surface of the oscillator pedestal facing said base surface of said crystal oscillator; a non-defective product is assumed to be one in which the upper surface of each of said protrusions is a flat surface, but a defective product is assumed to be one in which the flat surface of said protrusion is ridged; and only a non-defective product is mounted onto the base surface of the crystal oscillator. This makes it possible to provide a method of fabricating a crystal oscillator by which reliability is increased while the strength of the oscillator pedestal is maintained.

3 Claims, 7 Drawing Sheets

FIG. 1

STEP 1

FORM PEDESTAL FOR
CRYSTAL OSCILLATOR

STEP 2

DETERMINE QUALITY FROM
PROTRUSIONS

| RIDGED | (DEFECTIVE PRODUCT) | FLAT | (NON-DEFECTIVE PRODUCT) |

STEP 3

DISCARD

FABRICATE CRYSTAL OSCILLATOR
WITH PEDESTAL

METHOD OF FABRICATING CRYSTAL OSCILLATOR WITH PEDESTAL

BACKGROUND OF THE INVENTION

The present invention relates to a crystal oscillator with pedestal, based on a method of determining the quality of an oscillator pedestal fabricated by injection molding using a mold with a liquid-crystal polymer as a raw material (hereinafter called an "oscillator with pedestal").

DESCRIPTION OF RELATED ART

A crystal oscillator is known as a frequency control element that forms an oscillation circuit which can be built into various types of electronic device as a reference source for frequency or time, by way of example. One type of such a crystal oscillator is an oscillator with pedestal that is suited for surface mounting device (SMD), wherein an oscillator pedestal is provided on a base surface of a crystal oscillator from which lead wires extend.

An example of a prior-art oscillator with pedestal is shown in FIGS. 4 and 5, where FIG. 4A is a longitudinal section therethrough, FIG. 4B is a plan view thereof, FIG. 5A is a longitudinal section showing a partial section of the prior art oscillator, and FIG. 5B is a partial section taken from the line V-V in FIG. 5A.

As shown in FIGS. 4 and 5, this oscillator with pedestal consists of a crystal oscillator 1 and an oscillator pedestal 2. The crystal oscillator 1 holds a crystal piece on supporters (not shown in the figure) above a metal base 4 through which a pair of lead wires 3 pass, insulated by glass (not shown in the figure), then is sealed by a metal cover 5 using a method such as resistance welding. As shown in FIG. 5, this prior-art example of the oscillator pedestal 2 has a through-hole 6 at each end thereof, and a flattened lead terminal 7 crosses each through-hole 6 in the widthwise direction and then is bent and attached to the underside of the oscillator pedestal, as shown in FIG. 5B. The flattened lead terminals 7 function as terminals for surface mounting onto a setting substrate (not shown in the figures).

A small hole 7a is formed at a position that crosses each through-hole 6 of the flattened lead terminal 7, and also a protrusion 8 for positioning is formed at each of four corner positions of the outer periphery of the surface of the oscillator pedestal 2. These positioning protrusions 8 come into contact with the points marked A in the figures, at the four corner positions of the metal base 4 of the crystal oscillator 1, or in close proximity that is equivalent to such contact. The main part of the oscillator pedestal 2 is formed of a liquid-crystal polymer, and is formed integrally with the flattened lead wires 3 by an injection molding method using a shaping mold. Note that this liquid-crystal polymer is a generic term for a high-molecule substance that exhibits a liquid-crystal structure, which is generally able to achieve superior thermal resistance, strength characteristics, and dimensional stability due to the utilization of a high level of its orientation during the molding process.

In the thus-configured oscillator pedestal 2, the base surface (the metal base 4) of the crystal oscillator 1 is positioned by the protrusions 8 provided at the four corner portions around the outer periphery thereof, and also the leading ends of the lead wires 3 extending out from the base surface of the crystal oscillator 1 pass through the small holes 7a in the flattened lead terminals 7 and are connected by the means of solder S or the like. This makes it possible to provide an extremely reliable crystal oscillator 1 for inexpensive surface mounting use. (Refer to Japanese Patent Publication No. 3,633,971.)

PROBLEM WITH THE PRIOR ART

However, with the prior-art oscillator with pedestal of the above-described configuration, damage and cracking can occur in the oscillator pedestal 2 after the injection molding thereof, which is a problem in that it often leads to dimension abnormalities. In other words, the liquid-crystal polymer that is the raw material of the oscillator pedestal 2 is in a molten state during the injection molding, but the orientation of each straight chain of molecules M will differ once it has solidified, as shown in FIG. 6A. If the orientation of the straight chains of the molecules M are continuous in the hardened state after the injection molding (as shown in FIG. 6B), a liquid-crystal structure having favorable characteristics such as strength characteristics will be obtained.

However, subtle differences in pressure and temperature acting on the molten resin (liquid-crystal polymer) that is injected into the mold during the injection molding could cause discontinuities in the orientation of the straight chains of the molecules M, as shown in FIG. 6C. Thus the strength that is a characteristic of liquid-crystal polymer would deteriorate in such a case, leading to damage due to this lack of strength, which causes problems in that the product would be defective as an oscillator pedestal.

In addition, even if damage does not occur to the oscillator pedestal after the injection molding, problems such as damage, cracking, or "short-molding" (compression) can occur to the completed crystal oscillator with pedestal during shock testing (including thermal testing) and aging characteristics testing. Furthermore, damage due to factors such as shock caused by insufficient strength can occur after shipping to the customer. This would cause even greater problems in that a failure in a shipped crystal oscillator with pedestal that has been installed in an expensive electronic device will cause the completed product to become defective.

OBJECTIVE OF THE INVENTION

An objective of the present invention is to provide a method of fabricating a crystal oscillator with pedestal, for an oscillator that has increased reliability while the strength of the oscillation pedestal is maintained.

SUMMARY OF THE INVENTION

The present invention is advantageous in focusing on changes in the protrusions 8 for positioning of the oscillator pedestals 2 in which damage has occurred (defective products), in comparison with non-defective products, when it comes to inspect the oscillator pedestal 2 of the prior-art example that was described with reference to FIG. 4. In other words, if the oscillator pedestal 2 is a non-defective product, an upper surface 8a of each protrusion 8 for positioning is a flat surface that followed the inner peripheral surface of the mold as shown in FIG. 7A (which is an enlargement of the circled portion P' of the previously described FIG. 4A), whereas if the oscillator pedestal 2 is a defective product, the upper surface 8a of the protrusion 8 for positioning is formed to have a ridge (see FIG. 7B). The results of this inspection are applied to a method of determining the quality of an oscillator pedestal that is used in the present invention.

MEANS FOR SOLVING THE PROBLEMS

The present invention relates to a method of determining the quality of an oscillator pedestal for surface mounting, which is provided on a base surface of a crystal oscillator from which a pair of lead wires extends and which is formed by injection molding using a mold with a liquid-crystal polymer as raw material; where protrusions that follow the shape of said mold are provided on at least four corners around the outer periphery of the surface of the oscillator pedestal facing said base surface of said crystal oscillator; and the quality of the pedestal is determined from the molded state of those protrusions.

The present invention also relates to a method of determining the quality of an oscillator pedestal wherein an upper surface of each protrusion is taken to be a flat surface following the shape of said mold, such that a non-defective product is assumed to be one in which the upper surface of each of said protrusions is a flat surface after said injection molding, but a defective product is assumed to be one in which the flat surface of said protrusion is ridged.

An oscillator pedestal that has been determined to be a non-defective product (acceptable product) by the method of determining the quality of an oscillator pedestal in accordance with the present invention is provided on the base surface of the crystal oscillator to produce a crystal oscillator with pedestal.

Since the method of fabricating a crystal oscillator in accordance with the present invention determines the quality thereof from the molded state of the flat surfaces of the protrusions provided on the surface of the oscillator pedestal, it is possible to preemptively exclude any product after the injection molding that is likely to become a defective product after testing such as shock testing (including thermal testing) and aging characteristics testing, and also after shipping. Since oscillator pedestals that are defective products are excluded before the shock testing and aging characteristics testing in such a case, it is no longer necessary to subject defective products to the shock testing and aging characteristics testing, thus increasing the productivity of crystal oscillators.

Furthermore, since the present invention ensures that surfaces of the protrusions formed at the four corner portions of the oscillator pedestal are flat surfaces, the mold itself need not have a complicated shape, thus simplifying the fabrication thereof. If the upper surface of each protrusion is a flat surface, this is a non-defective product; whereas if it is ridged, this is a defective product. This therefore makes it possible to determine the quality reliably by means such as direct visual inspection or image recognition (image processing).

Since the present invention ensures that only oscillator pedestals that are non-defective products are provided for the crystal oscillators, it prevents faults in the oscillators with pedestals after shipping, thus increasing reliability. Since oscillator pedestals that are defective products are excluded before the shock testing and aging characteristics testing in such a case, it is no longer necessary to subject defective products to the shock testing and aging characteristics testing, thus increasing productivity.

BRIEF DESCRIPTION OF THE DRAWINGS

FIG. 1 shows a fabrication process which is illustrative of a method of fabricating an oscillator with pedestal, based on a method of determining the quality of the oscillator pedestal in accordance with the present invention;

FIG. 2 shows an embodying example of an oscillator with pedestal in accordance with the present invention, in which protrusions stand vertical, where

FIG. 3 shows partial expanded views of a portion P shown in FIG. 2 of one of the protrusions of the oscillator with pedestal in accordance with the present invention, where

FIG. 4 is illustrative of a prior-art example of an oscillator with pedestal, showing positioning portions at the base of the protrusions, where

FIG. 5 is further illustrative of a prior-art example of an oscillator with pedestal, where

FIG. 6 shows schematic views of the molecular structure of a liquid-crystal polymer to illustrate a problem with the prior-art example and the focus of the present invention, where FIG. 7 is partial expanded plan views of an oscillator pedestal illustrating the problem with the prior-art example and the focus of the present invention, where

DETAILED DESCRIPTION OF PREFERRED EMBODIMENTS

A fabrication process which is illustrative of a method of fabricating an oscillator with pedestal, based on a method of determining the quality of the oscillator pedestal in accordance with the present invention is shown in FIG. 1.

Figure 7A:
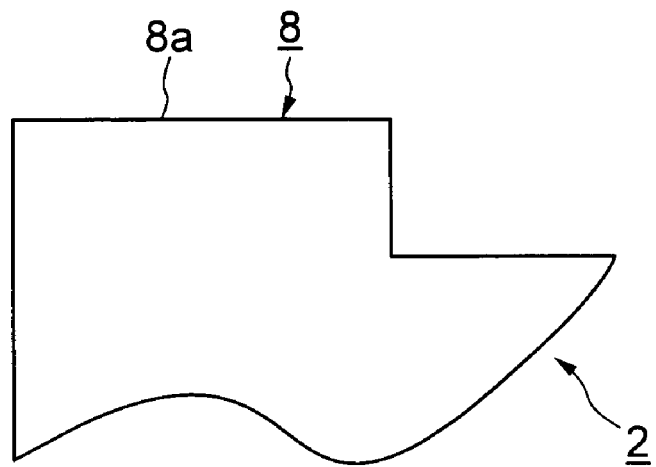
FIG. 7A is a partial expanded view of a protrusion of anon-defective product and FIG. 7B is a partial expanded view of a protrusion of a defective product.
Figure 7B:
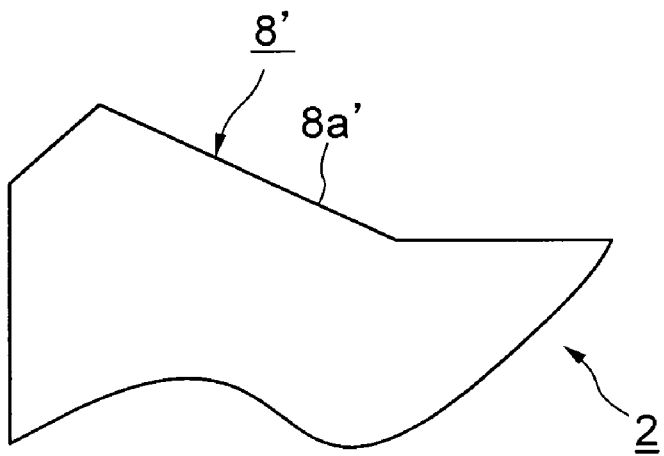

First of all, the oscillator pedestal 2 (see FIG. 2) is formed from a liquid-crystal polymer by injection molding using a mold, as shown in FIG. 1 (step 1). The oscillator pedestal 2 in this case has the through-holes 6 through which pass the flattened lead terminals 7 for surface mounting, and also has the protrusions 8 for positioning at, at least a corner portion, preferably four corner portions of the outer periphery of the surface, facing the base surface of the crystal oscillator 1 from which the lead wires 3 extend. The upper surfaces of these protrusions 8 are formed as flat surfaces that follow the inner peripheral surface of the mold (see the previously described FIGS. 4, 5, and 7).

Figure 3A:
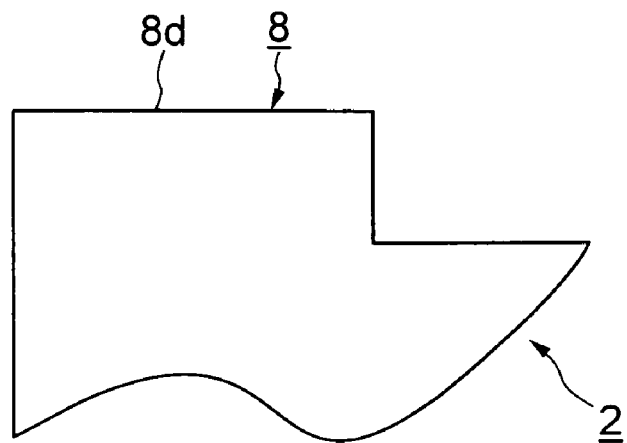
FIG. 3A is a partial expanded view of a protrusion of a non-defective product and FIG. 3B is a partial expanded view of a protrusion of a defective product.
Figure 3B:
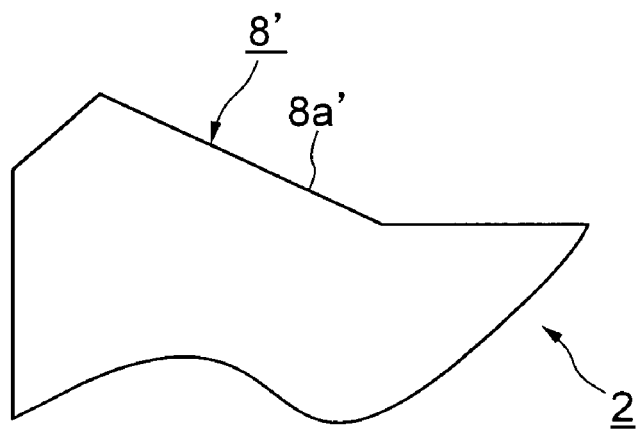

Next, the system determines the quality of the oscillator pedestal 2 from the shape of the protrusions 8 (step 2). In other words, if the upper surface 8a of each protrusion 8 is a flat surface that follows the mold, that is determined to be a non-defective product (see FIG. 3A), whereas if it is a ridge 8a', that is determined to be a defective product (see FIG. 3B). This process can be done by an operator directly, by means such as visual inspection or image recognition (image processing), and products in which the upper surface of the protrusion 8 is a ridge 8a' are discarded as defective products.

Finally, the crystal oscillator 1 is mounted on an oscillator pedestal 2 that has passed as a non-defective product (step 3).

Figure 2A:
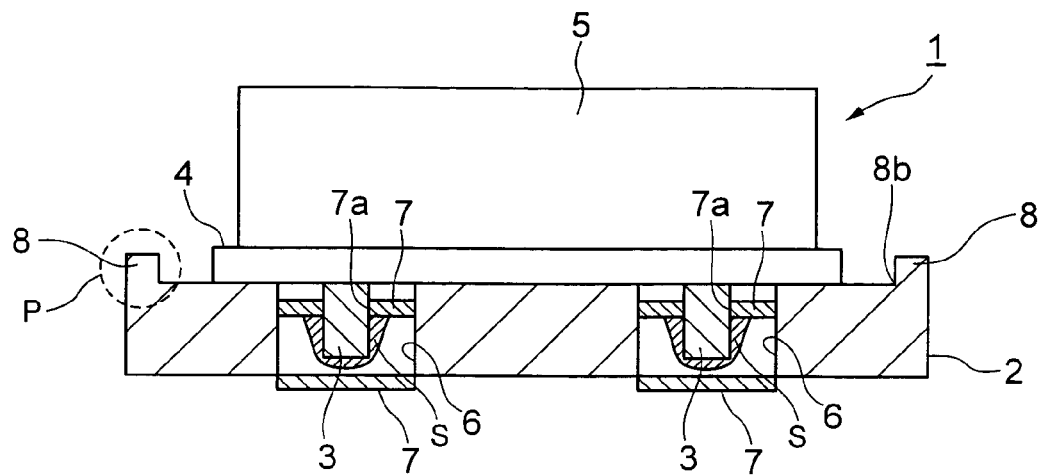
FIG. 2A is a section therethrough and FIG. 2B is a plan view.
Figure 4A:
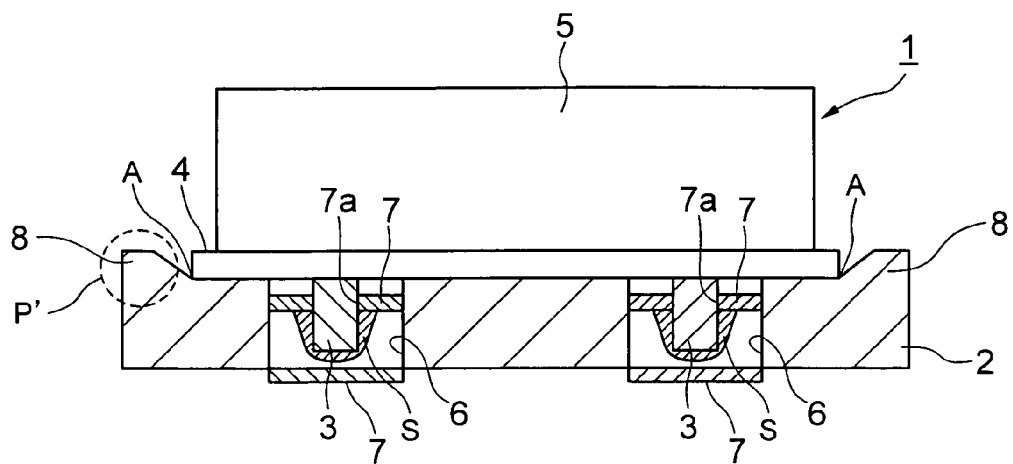
FIG. 4A is a longitudinal section therethrough and FIG. 4B is a plan view.
Figure 4B:
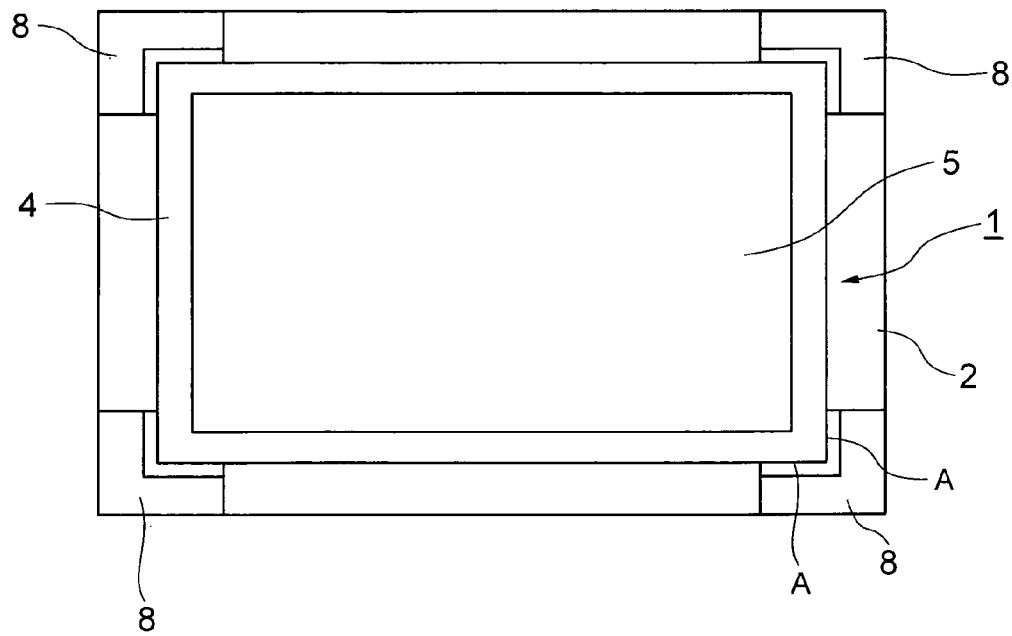
Figure 5A:
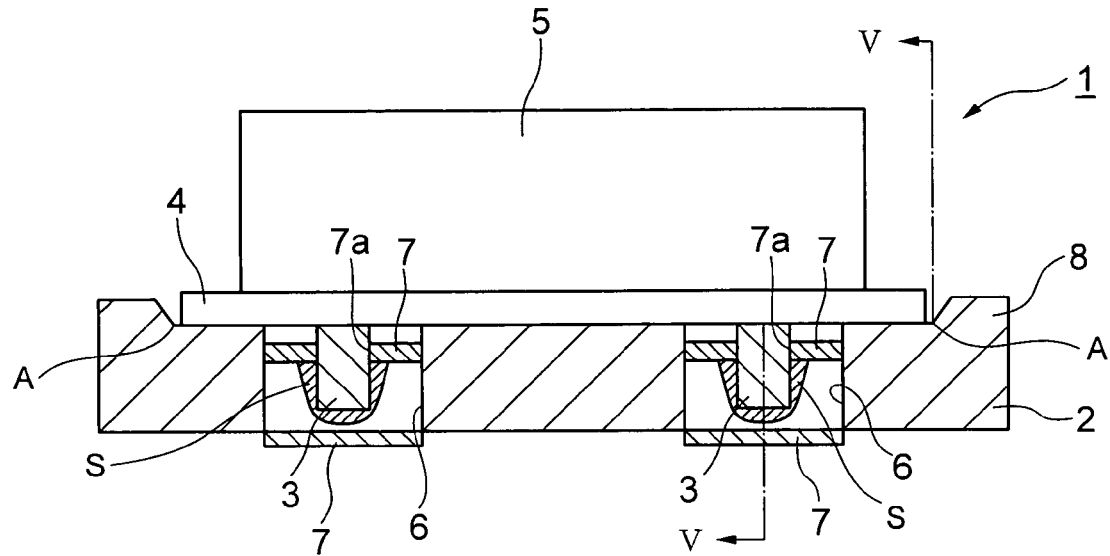
FIG. 5A is a longitudinal section therethrough as a partial section and FIG. 5B is a partial section taken along the line V-V of FIG. 5A.
Figure 5B:
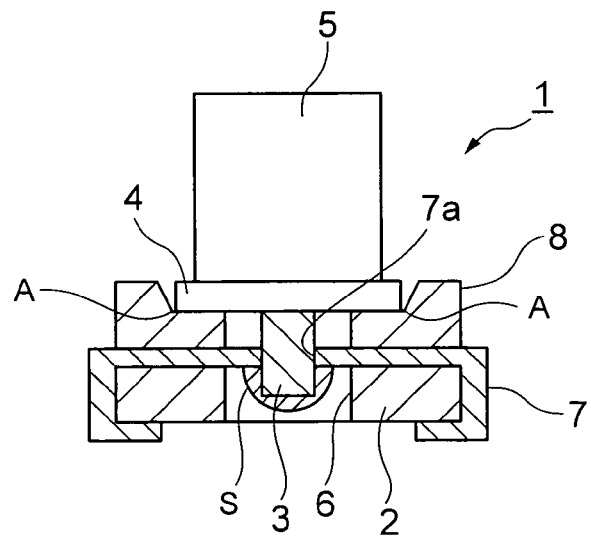
Figure 6A:
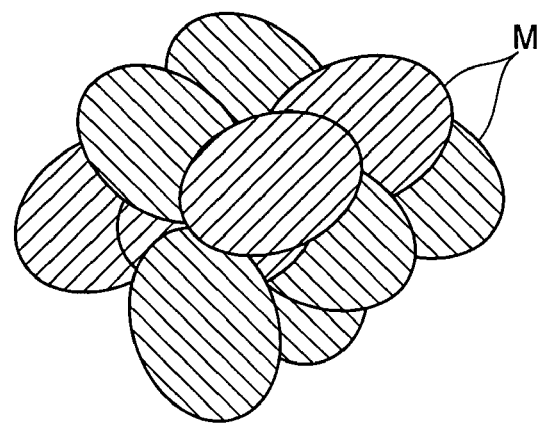
FIG. 6A is a schematic view of the molecular structure of a liquid-crystal polymer that illustrates the problem with the prior-art example and the focus of the present invention.
Figure 6B:
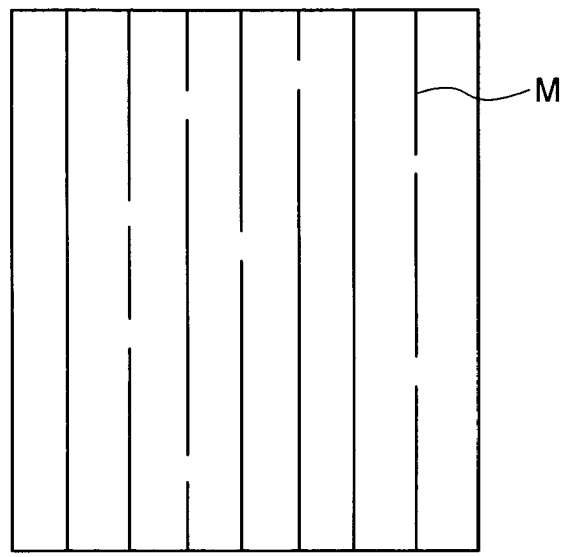
FIG. 6B shows straight chains of continuous molecules in a non-defective product.
Figure 6C:
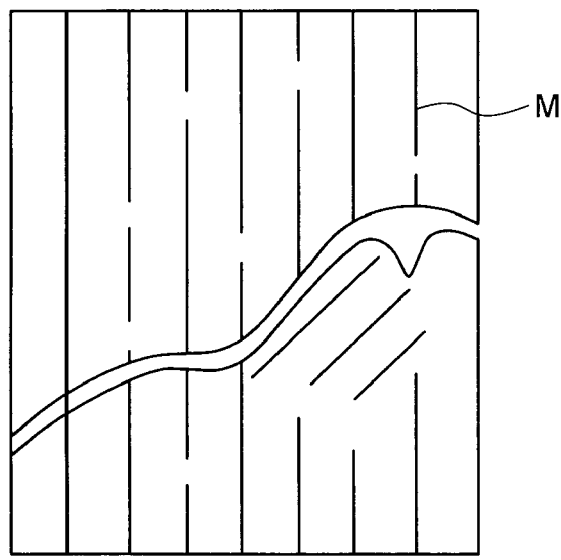
FIG. 6C shows discontinuous chains of molecules in a defective product.

In other words, the lead wires 3 are passed through the small holes 7a of the flattened lead terminal 7, as shown in FIG. 2A, and the base surface of the crystal oscillator 1 is positioned by the protrusions 8, then the lead wires 3 are connected to the flattened lead terminals 7 by means such as soldering or spot welding S (see the previously described FIGS. 4A and 5A).

With this method of fabricating a crystal oscillator, the quality of the molded products (pedestals) is determined from the molding state of the upper surfaces 8a or 8a' of the protrusions 8 provided on the surface of each oscillator pedestal 2, where the upper surface of each protrusion 8 in this case either a flat surface 8a that follows the mold or a ridge 8a'. It is therefore possible to preemptively exclude any product after the injection molding that is likely to become a defective product after testing such as shock testing (including thermal testing) and aging characteristics testing, and also after shipping.

Since the present invention determines quality from whether the surface of each protrusion 8 is a flat surface that follows the mold or a ridge 8a', the quality can also be determined simply and also reliably by means such as direct visual inspection or image recognition (image processing). In addition, the upper surface of each protrusion 8 is a flat surface, so that the mold itself need not have a complicated shape, facilitating the fabrication thereof.

Since the oscillator with pedestal can be fabricated by mounting the crystal oscillator 1 only on a oscillator pedestal 2 that is a non-defective product, this preemptively prevents faults from occurring in the oscillator with pedestal after shipping, thus increasing reliability. Since the oscillator pedestals 2 that are defective products can be excluded before shock testing and aging characteristics testing are performed in this case, there is no need to perform such shock testing and aging characteristics testing on these defective products, thus increasing the productivity thereof.

In the above-described embodying example, the protrusions 8 provided at the four corner positions around the outer periphery of the surface of the oscillator pedestal 2 are used for positioning the crystal oscillator 1, but it is not absolutely necessary to use them for positioning; the two lead wires 3 could equally well be used for positioning. In essence, the protrusions 8 could be provided as means for determining the quality of at least the four corner positions around the outer periphery of the surface of the oscillator pedestal 2. It should be obvious to those skilled in the art that the protrusions 8 need not be provided at the four corners of the pedestal 2, but could be formed around the entire periphery thereof. In such a case, the detection rate of defective products would increase if the entire periphery is raised. In addition, the surfaces of the protrusions 8 were described as flat surfaces, but they are not limited thereto and thus the protrusions 8 can be of any shape that enables the determination of quality.

Figure 2B:
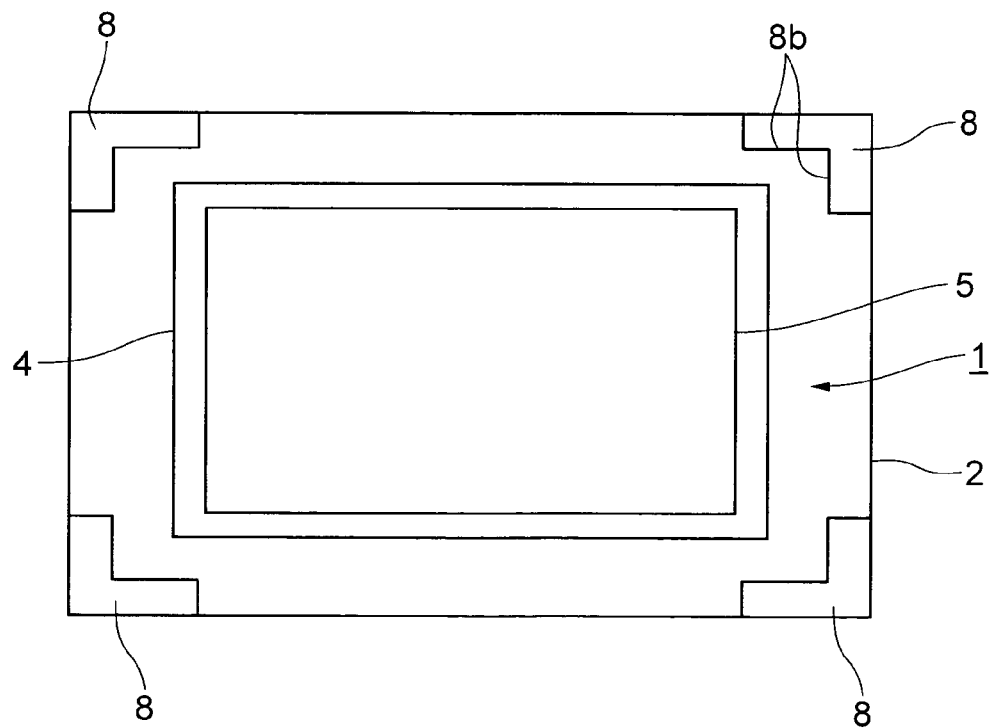

Furthermore, the outer periphery of the base surface of the crystal oscillator 1 need not be placed in close proximity to the protrusions 8 equivalent to contact therewith, as shown in FIG. 2, so that an inner wall 8b of each protrusion 8 can be disposed at a distance from the outer periphery of the base surface of the crystal oscillator 1, provided the spacing of the terminals is the same. In such a case, oscillator pedestals 2 fabricated by using the same mold can be used in common for mounting crystal oscillators 1 with different sizes of base surface, provided the spacing of the lead wires 3 is the same, increasing productivity. Thus the same oscillator pedestal 2 can be used in common for crystal oscillators 1 having external shapes of differing dimensions, such as 11.0×4.7 mm or 9.0×4.0 mm.

The oscillator pedestal 2 was described above as having the flattened lead terminals 7, but the present invention can also be applied in a similar manner to a configuration in which only the main body has the through-holes 6 and the lead wires 3 of the crystal oscillator 1 are bent at the base surface side of the main body.

What is claimed is:

1. A method of fabricating a surface mounted crystal oscillator with pedestal, based on a determination of the quality of said pedestal, wherein said pedestal is to be provided on a base surface of a crystal oscillator from which a pair of lead wires extends, the method comprising the steps of:

forming, in a mold, said pedestal by injection molding with a liquid-crystal polymer material, the forming step including forming one or more protrusions following the shape of said mold, said one or more protrusions extending upwardly from at least one corner of a periphery of an upper surface of said pedestal;

determining a polymer chain quality of said pedestal from the molded state of said one or more protrusions, wherein the polymer chain quality of said pedestal is determined to be non-defective if an upper surface of each of said one or more protrusions is a substantially flat surface and is substantially parallel to the upper surface of said pedestal as an indication of straight chains of said liquid-crystal polymer being continuous, and the polymer chain quality of said pedestal is determined to be defective if the upper surface of said one or more protrusions is substantially ridged as an indication of straight chains of said liquid-crystal polymer being discontinuous after said injection molding; and mounting said pedestal, determined to be non-defective in the determining step, onto said base surface of said crystal oscillator, wherein the determining step is performed after the forming step and before the mounting step.

2. The method of fabricating a crystal oscillator with pedestal according to claim 1, wherein a base of each of said one or more protrusions has positioning means that comes into contact with an outer periphery of said base surface of said crystal oscillator.

3. The method of fabricating a crystal oscillator with pedestal according to claim 1, wherein inner walls of said one or more protrusions rise substantially vertically from said upper surface of said pedestal, and said one or more protrusions are spaced from an outer periphery of said base surface of said crystal oscillator.

* * * * *